United States Patent [19]

Hörnfeldt et al.

[11] 4,197,515
[45] Apr. 8, 1980

[54] SYNCHRONOUS FILTER

[76] Inventors: Sven P. Hörnfeldt, Torgnyvägen 30 A, S-183 42 Täby; Karl O. U. Gäfvert, Sköldungagatan 14, S-753 34 Uppsala, both of Sweden

[21] Appl. No.: 839,565

[22] Filed: Oct. 5, 1977

[51] Int. Cl.² .................. H03H 7/14; H03H 7/10; H04B 15/00

[52] U.S. Cl. ........................... 333/165; 333/19; 333/173

[58] Field of Search ............... 333/70 A, 70 T, 70 R, 333/19, 70 CR, 18, 28 R, 165, 166, 173; 328/127, 167, 165, 158; 307/221 D; 325/473–474, 323–324; 364/825, 829, 830, 862; 329/50; 179/15 A, 15 B

[56] References Cited

U.S. PATENT DOCUMENTS

| | | | |
|---|---|---|---|
| 3,268,824 | 8/1966 | Hinrichs et al. | 328/165 |
| 3,518,557 | 6/1970 | Harmuth et al. | 328/139 |
| 3,681,701 | 8/1972 | Maier | 333/70 A X |
| 3,714,581 | 1/1973 | Sage | 328/127 X |
| 4,032,720 | 6/1977 | Morez et al. | 179/15 A |

OTHER PUBLICATIONS

Komachi et al.-"Lock-In Amplifier Using a Sampled-Data Synchronous Filter", 8 Journal of Physics E: Scientific Instruments 1975, pp. 967–971.

Nittrouer-"Modern Signal Processing Techniques for Overcoming Noise", Technical Notes T-200, Princeton Applied Research, 1968; 12 pages.

*Primary Examiner*—Alfred E. Smith
*Assistant Examiner*—Marvin Nussbaum
*Attorney, Agent, or Firm*—Finnegan, Henderson, Farabow, Garrett & Dunner

[57] ABSTRACT

By combining a number of integrators with periodically switching means, which are sensing an input signal during circularly successive time intervals, sampled values are available for some of the latest time intervals sampled with a sampling frequency. By switching these values in a successive manner to an analog arithmetic circuit, it is possible to obtain an output signal with useful band-pass and band-reject properties depending on the sampling period and the arithmetic operation. According to one preferred embodiment, the output signal is the mean over the latest time intervals, giving an averaging system which, contrary to RC circuits, has a strictly limited memory. According to another preferred embodiment, the output signal is the different between the outputs of two integrators.

7 Claims, 20 Drawing Figures

EMBODIMENT IN SLP APPLICATION

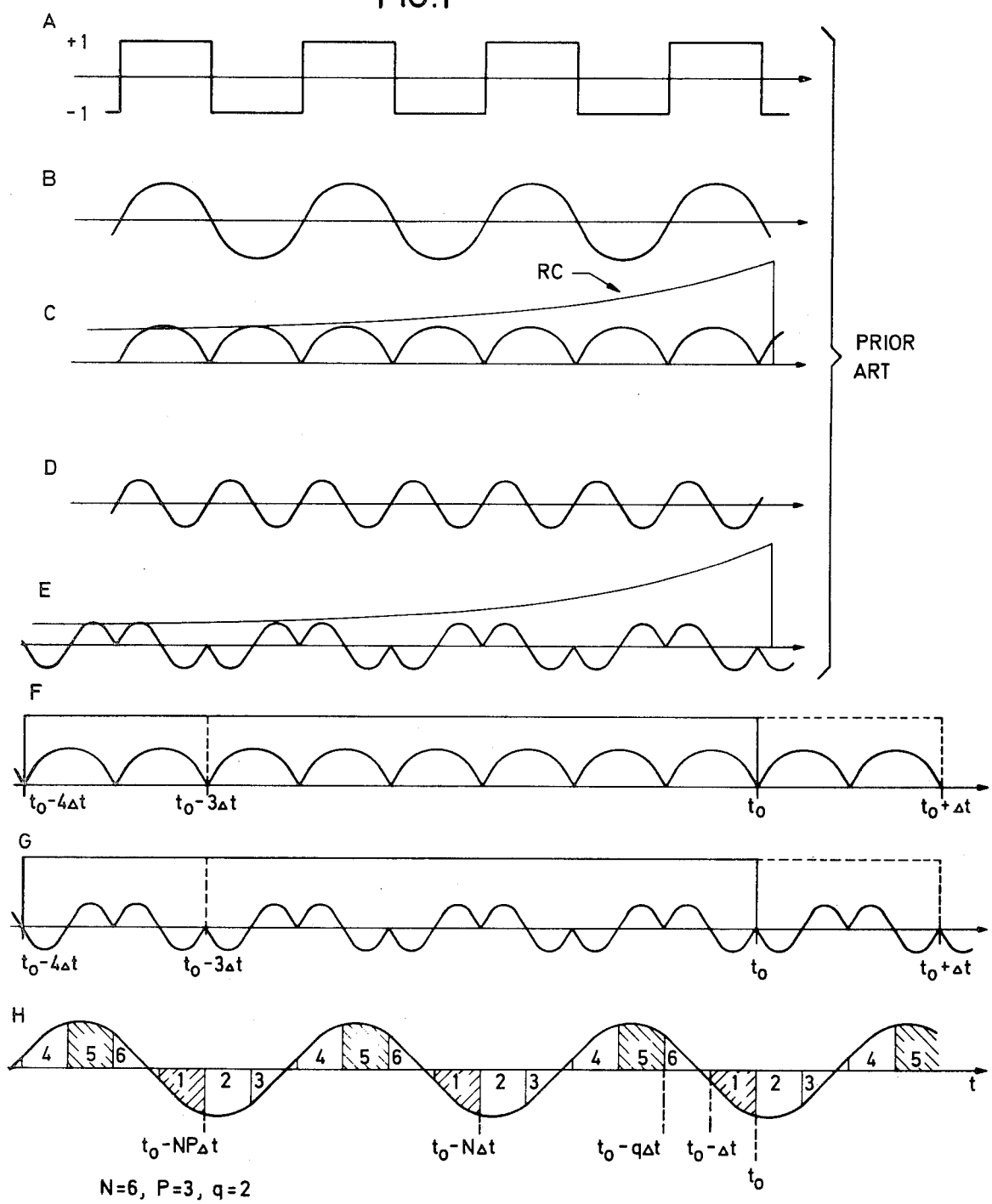

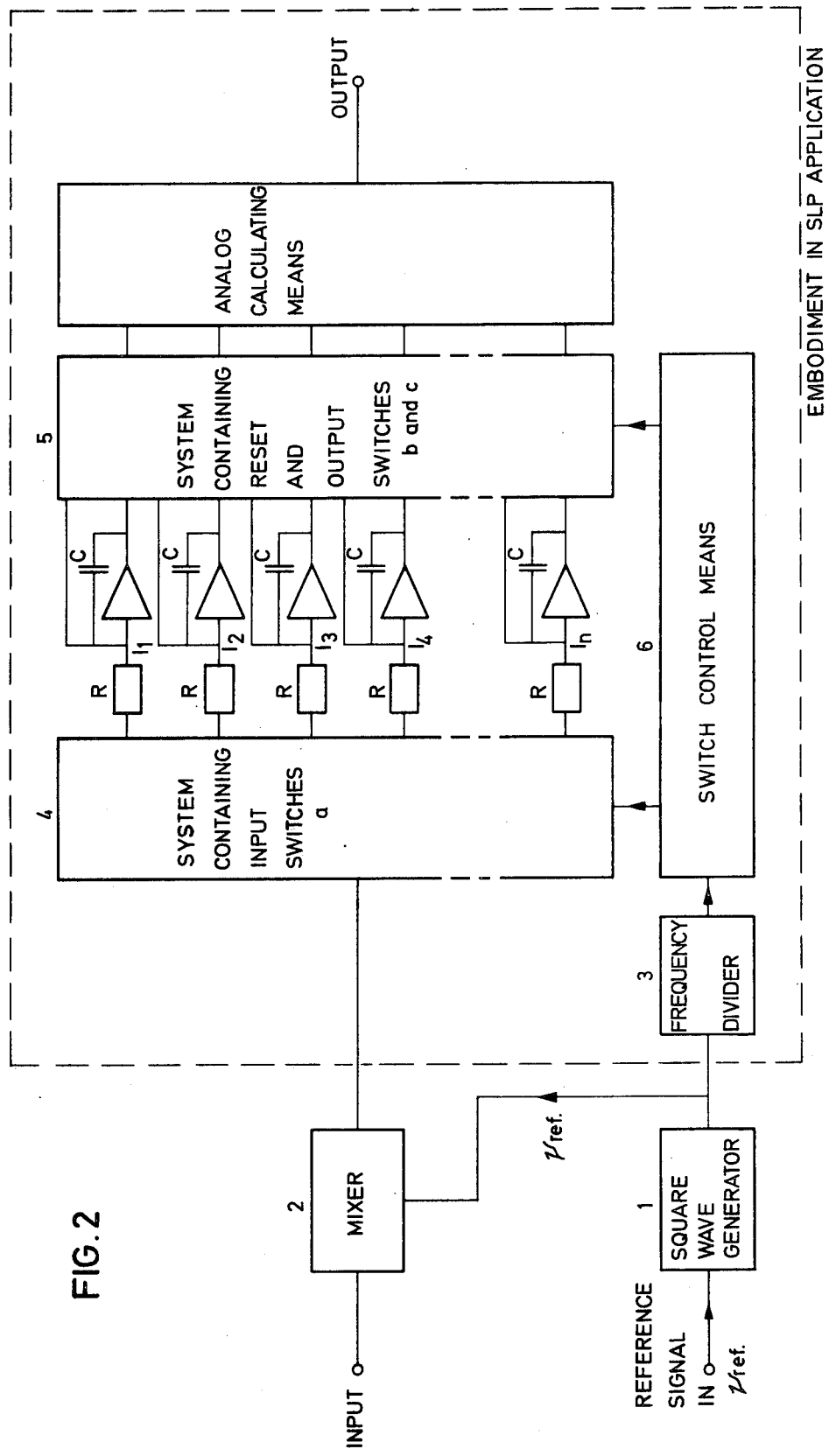

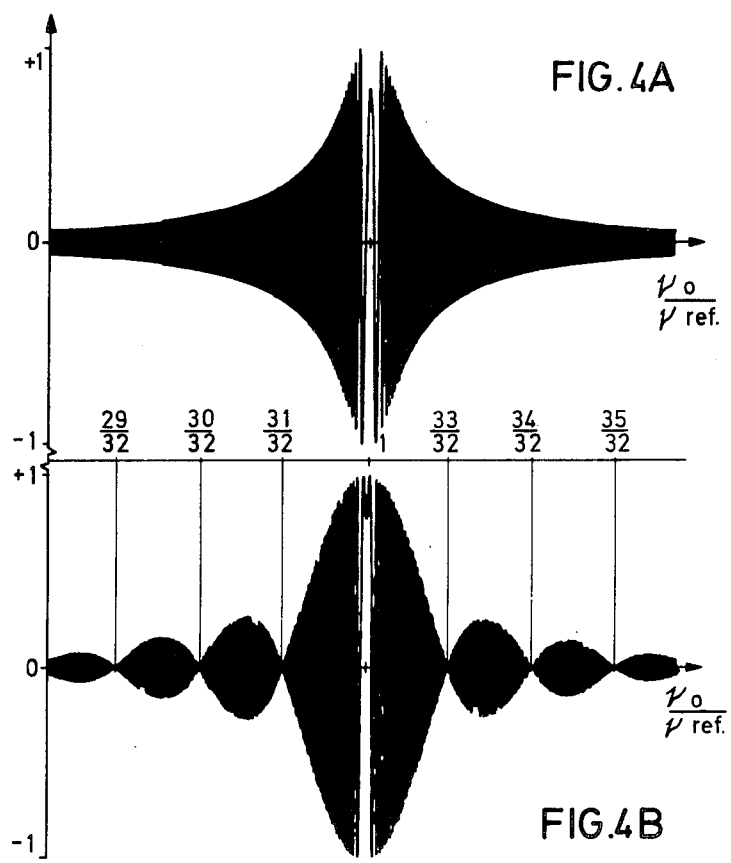
FIG.4A
FIG.4B
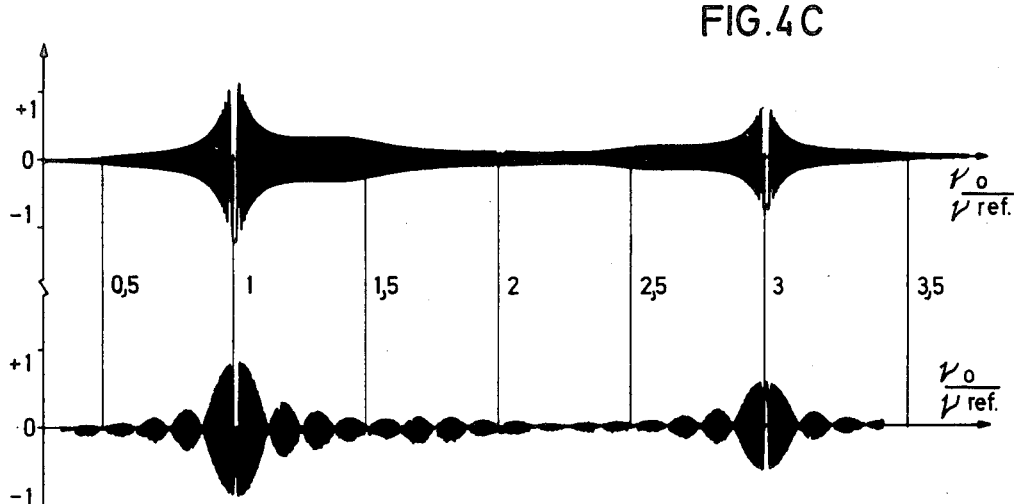
FIG.4C
FIG.4D

SYNCHRONOUS FILTER

BACKGROUND OF THE INVENTION AND NEAREST PRIOR ART KNOWN

The present invention relates in general to synchronous detection of AC signals, and more particularly concerns novel apparatus and techniques for improved rejection of noise by means of synchronous switching.

Synchronous detection has been employed for a long time to detect small AC signals buried in noise. One common application of synchronous detection is the lock-in amplifier in which the signal is multiplied with a square wave generated from a reference signal. The result is then applied to a low-pass filter. In this way a DC voltage is generated that is proportional to the amplitude of that part of the detected signal that coincides in phase (and frequency) with the reference signal. Spurious signals of frequencies different from the reference frequency ($\nu_{ref}$) (or its odd harmonics) when mixed with the reference signal give rise to beats that are suppressed in the low-pass filter normally used according to prior art.

The time constant of the low-pass filter has to be chosen very long if the disturbing signals are large compared with the wanted signal. This leads to the inconvenience that strong short disturbances, such as transients from power switches or starting electrical motors, block the lock-in amplifier for a long time after the disturbance has ceased to exist. Pick-up from the main supply is one common source of noise. 50 (or 60) Hz rumble is then superimposed on the signal and, in spite of careful shielding, the pick-up noise very commonly dominates at signal levels below 1 $\mu$V.

A summary of the subject may be found in two articles by Charles A. Nittrouer in the September and October 1968 issues of the Electronic Instrument Digest, and these articles are hereby included by reference in the present disclosure.

The development of new integrated circuits has led to attempts to improve the rejection of noise in synchronous detection which can be reached by means of RC filter or the like. An example of this is described in an article by Komachi and Tanaka entitled "Lock-in Amplifier using a sampled-data synchronous filter" and published in J. Sci. Instr. 8 967 (1975). The idea presented is to use a number of capacitors and a differential amplifier which receives on one input the voltage across a capacitor which is being charged during a given time interval, and on the second input the voltage from a capacitor that has been charged during an earlier time interval. Komachi and Tanaka have demonstrated how this arrangement can be used as a narrow band-pass filter. There are however disadvantages with their design as, for example, the fact that the input signal, via an LP filter, is always connected to the input of the differential amplifier and hence will affect the output instantaneously. If the RC time of the filter is very long, a disturbance that has occurred during a certain time period will affect the output for a long time.

OBJECTS OF THE INVENTION

It is an object of the invention to construct a filter useful in synchronous detection application and which improves noise rejection at one or more predetermined frequencies, e.g. the main line frequency.

It is another object of the invention to construct a filter which is free of the memory effect shown in RC circuits or the like and which has a finite memory, so that previous values of a measured variable will carry zero weight if they are older than a predetermined age.

Further objects, improvements and features of the invention will be apparent from the following description of embodiments of the invention.

SUMMARY OF THE INVENTION

According to the invention, there is provided a filter circuit in which there is a given number of integrating circuits. Each integrating circuit, which may be of any suitable construction known in the art, is provided with a signal input, a signal output, and a resetting input. The filter circuit further comprises switching means, so that a general input of the filter circuit may be switched to sequential or successive ones of the integrating circuit inputs for sampling. The output of the filter circuit is obtained by analog calculation from sequential or successive ones of the integrating circuit outputs. The resetting inputs are also sequentially or sucessively selected at regular intervals. The switching is done under the control of clock signals.

According to one embodiment which is preferred at the present time, the inputs of the integrating circuits are successively connected to the output of the mixer of a lock-in amplifier. The output of the filter circuit is calculated as the means value of all outputs of the integrating circuits which are neither receiving an input signal nor being reset. This mean value thus represents a mean value for the filter circuit input during a number of past time intervals, generally extending over several periods of the reference frequency. This mean will be a true mean value of the studied signal taken over a definite time interval which is stepwise moving in real time. As explained in the detailed description, this mean value and thus the output signal for a given reference frequency will be zero for a number of input signal frequencies. This embodiment is generally speaking an LP filter which, in conjunction with the mixer, has specific band reject properties (see detailed description). Hereinafter this embodiment is referred to as a synchronous low-pass (SLP) filter.

According to another embodiment, the outputs from the integrating circuits are treated in another way. The switching means include means arranged to select sequentially one of the outputs and couple it to one input of a difference calculator which may be an ordinary differential amplifier well-known in the art. At the same time another output which thus represents the input to the filter circuit at another, i.e. earlier, time is sequentially switched to the other input of the differential amplifier. This embodiment may be called the synchronous band-pass/reject (SBPR) application of the invention. As is described in the detailed description of the embodiments, this filter which is applied directly to the AC signal, has useful band-pass/reject characteristics.

BRIEF DESCRIPTION OF THE DRAWING

FIGS. 1A–1H show time diagrams illustrating signal processing under synchronous detection.

FIG. 2 is a schematic block diagram of a lock-in amplifier with a synchronous filter employing integrator circuits as storage units.

FIGS. 4A–4H show response curves according to the invention in the SLP application and compared with theory and prior art.

DETAILED DESCRIPTION OF PREFERRED EMBODIMENTS

Figure 3A:
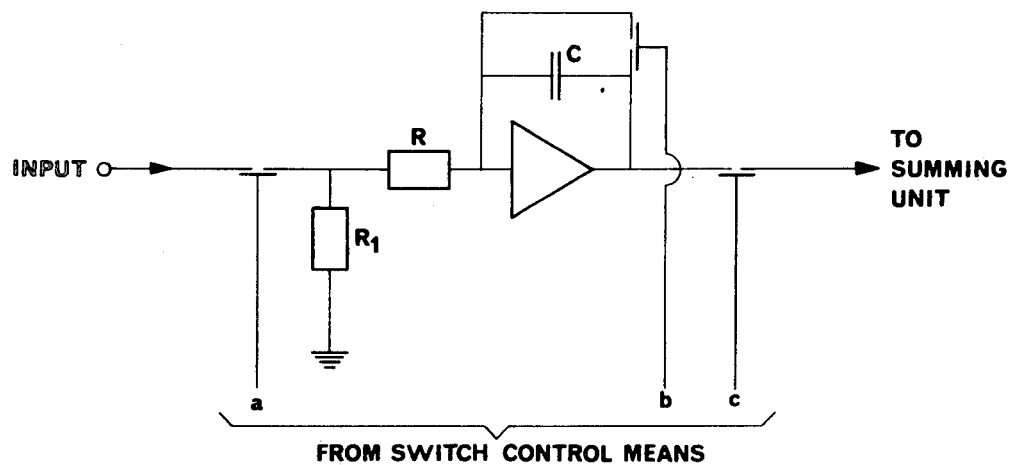
FIG. 3A shows one of the integrators of FIG. 2 and demonstrates its switching facilities as controlled by the switch control means.

A. Design of the SLP filter.

The SLP filter is designed to replace the ordinary low-pass filter in a lock-in amplifier. It may therefore be helpful to the understanding of the present invention and some of its advantages if the working principle of the lock-in amplifier is briefly explained.

The general idea with lock-in amplification is to multiply a modulator waveform, as A in FIG. 1, with a signal which is to be examined. For a signal with the same frequency and phase (B in FIG. 1) as the modulator waveform, the waveform C of FIG. 1 is obtained. If this signal is passed through a conventional low-pass filter, it is apparent that a signal with a significant DC component will be obtained, since the output is weighed with a backwards decreasing function RC of FIG. 1C. It is well-known that if the signal is 90° out of phase, the DC component of the output signal will be zero. This means that it is possible to obtain phase-dependent rejection so that a signal at the reference frequency having the proper phase may be extracted from even an extremely noisy signal.

However, the response for signals of frequencies different from the reference frequency will never be zero. In the waveform D of FIG. 1, for example, we see a signal at a frequency which is twice the reference frequency. When this waveform is detected by means of the same lock-in amplifier, we see that the resulting waveform E consists of two positive pulses followed by two negative pulses. It is clear that the mean value for this waveform is zero, but when an RC filter is used to filter it, a small AC signal will pass through, having the reference frequency. This is because of the exponential weight function in time of the RC filter.

With the SLP filter of the invention, on the other hand, the output signal is at each moment the integral of the input signal over a predetermined time interval of past time, and this time interval is periodically stepped in time with a predetermined increment, the predetermined time length consisting of an integral number of such increments all of which have the same length.

Waveform F in FIG. 1 shows the idea when four increments constitute the predetermined time length. At any given time, the output signal consists of the integral over the four latest successive time increments. Between time $t_o$ and $(t_o+\Delta t)$ the output signal is the integral over the signal during the time $(t_o-4\Delta t)$ to $t_o$. An increment later the output is switched to the integral during the time $(t_o-3\Delta t)$ to $(t_o+\Delta t)$. It is clear from FIG. 1F that the SLP filter gives a pure DC signal for the input waveform B. FIG. 1G shows that the response in the second harmonic waveform D is identically zero.

We shall now explain an embodiment of an apparatus which performs this averaging. In FIG. 2 there is shown a block diagram of a lock-in amplifier provided with a filter according to the invention. As the principle of the lock-in amplifier is well-known to the man of the art, we may note only that a reference signal is made into a square signal in block 1 and "mixed" with the signal to be analyzed in the mixer circuit 2. In order to obtain a sampling frequency for the synchronous filter, the reference signal is treated in a frequency divider 3.

There are now in the coupling a number of integrating circuits I1–In, which may be any number (six in the actual embodiment we built). Each comprises a resistor R, a capacitor C and an amplifier. It is well-known to the man of the art that such a circuit will integrate its input voltage and give the result as an output.

FIG. 3A shows one of these integrating circuits each cooperating with three switches a, b and c, and an input resistor $R_1$. We see that when switch a is on, the integrating circuit will be integrating the signal from the mixer. We further see that it is possible to reset the integrating circuit to zero by shorting capacitor C by means of switch b, and that switch c couples the integrating circuit to a summing unit. The useful settings of the switches are apparent from the following table:

TABLE 1

| State of integrator | | Settings of switches | | |
|---|---|---|---|---|
| | | a | b | c |
| U: | Input on ground Output to summing unit | 0 | 0 | 1 |
| R: | Reset, input to ground Capacitor shorted | 0 | 1 | 0 |
| S: | Input to mixer Output open | 1 | 0 | 0 | where 1 denotes a closed switch and 0 an open switch.

Let us now compare with FIG. 1, waveform F. We assign an integrating circuit to each of the time increments $(t_o-4\Delta t \rightarrow t_o-3\Delta t)$; $(t_o-3\Delta t \rightarrow t_o-2\Delta t)$ ... etc. During time increment $(t_o \rightarrow t_o+\Delta t)$, we now want to obtain the sum of the integrator outputs from each of the four latest integrations. At the same time, one integrating circuit must be integrating. With the terminology of Table 1, we therefore need four integrators in state U and one in state S sensing the actual input signal. As resetting may not always be instantaneous, it may be practical to have at the same time one integrating circuit in state R, i.e. resetting during one full time increment. For sensing in the way shown in FIG. 1F, it is therefore reasonable to use six integrating circuits.

We thus see that the switches in block 4 and block 5 of FIG. 2 will have to be operated according to a certain method. Using the symbols of Table 1 and six integrators, we may therefore arrange the switching for successive time increments 1, 2, 3 ... 6 and for integrating circuits numbered I1, I2, I3 ... I6:

TABLE II

| Integrator | Time increment | | | | | |
|---|---|---|---|---|---|---|
| | 1 | 2 | 3 | 4 | 5 | 6 |
| I1 | S | U | U | U | U | R |
| I2 | R | S | U | U | U | U |
| I3 | U | R | S | U | U | U |
| I4 | U | U | R | S | U | U |
| I5 | U | U | U | R | S | U |
| I6 | U | U | U | U | R | S |

Figure 3B:
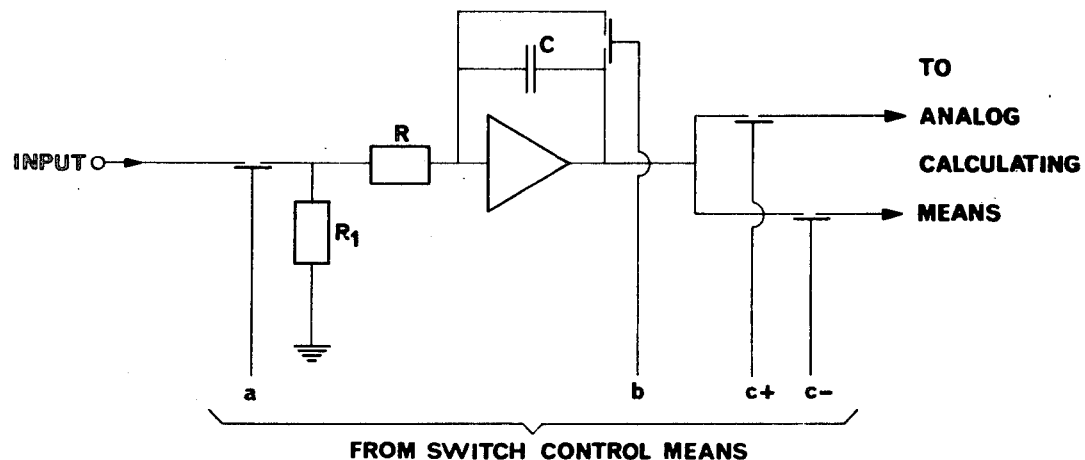
FIG. 3B shows one of the integrators used in the SBPR

It should now be apparent to those skilled in the art how the switching network may be arranged according to FIG. 2 in order to operate in the way shown in Table II. There are switches in the integrated circuit market which may be controlled by shift registers. We have used for the frequency divider 3 a counter circuit 74107 and a gate circuit 7408. The switch control means 6 comprises three shift registers of type 74164, each arranged to switch by means of the parallel outputs one of the sets of switches a, b and c respectively of FIG. 3.

The summing may be done by switching the relevant integrator voltages via resistors to an amplifier (not shown), in the described embodiment OP amplifier AD 520.

B. Theory of the SLP filter.

Let a signal of frequency $v_o$ and amplitude A $$U_{in}(t) = A e^{i2\pi v_o t} \tag{1}$$

be connected to the input of the mixer of a lock-in amplifier. The signal that enters the SLP filter can be written $$(-1)^n A e^{i2\pi v_o t} \quad n = [2v_{ref} t] \tag{2}$$

where [x] denotes the integral part of x.

We treat here the case with the integrators sampling during disjoint time intervals of length $Q/2v_{ref}$ (Q an integer). The output signal during time module $\lambda r$ ($\lambda r = [2v_{ref} t / Q]$) is the integral of the input to the filter during the N time modules r-N up to r-1. The output of the filter will have the form of a step function $$U_{out}(r) = \frac{-iA}{\pi v_o RC} \tan\left(\frac{\pi}{2} \frac{v_o}{v_{ref}}\right) \sin\left[\frac{\pi}{2} QN\left(\frac{v_o}{v_{ref}} + 1\right)\right] e^{i\pi Q \left(\frac{v_o}{v_{ref}} + 1\right)\left(r - \frac{N}{2}\right)} \tag{3}$$

where R and C are the parameters of the integrators.

If $v_o$ is chosen equal to $v_{ref}$ or an odd harmonic of this frequency, that is $v_o/v_{ref} = 2P+1$ where P=0,1,2 ... eq (3) gives:

$$U_{out}(r) = -\frac{QNiA}{\pi RC(2P + 1)v_{ref}} \text{ for all } r \tag{4}$$

This is a DC voltage proportional to the amplitude A of the signal.

$U_{out}(r) \equiv 0$ for all r if $v_o$ is equal to an even harmonic of $v_{ref}$.

Additional zeros appear for $$\frac{v_o}{v_{ref}} = \frac{2P}{QN} - 1 \begin{cases} P = 1, 2, \ldots \\ v_o/v_{ref} \neq (2P + 1) \, P = 0, 1, 2 \ldots \end{cases} \tag{5}$$

The described filter produces a pure DC voltage for an input signal of the same frequency as the reference signal. The low-pass filter in a conventional lock-in amplifier on the other hand gives, besides the DC component, an AC ripple of twice the frequency of the input signal, which is damped in the low-pass filter.

Other cases with, for example, overlapping integrating times can be treated in an analogous way and give similar characteristics.

The output signal of an ordinary lock-in amplifier contains AC components for all input frequencies. As shown above, the output signal will be identically zero for a number of frequency ratios $v_o/v_{ref}$ (eq (5)) in the described filter. This quality can be used to suppress noise of a given frequency.

When comparing the described SLP filter with an ordinary lock-in amplifier as to response to noise of irregular form type transients, the following advantages of the described filter can be noted. The output of the described filter is at every moment isolated from its input, thus only the average of the noise over the time period $QN/2v_{ref}$ can give any contribution to the output signal. The reset of the integrators causes the contribution from an occasional disturbance to disappear totally after the time $QN/2v_{ref}$. In an ordinary lock-in amplifier a transient will always affect the output signal instantaneously and the resulting charge in the low-pass filter will decrease exponentially with time. For suppression of 50-periodic noise the reference signal should be chosen so that $$v_{ref} = \frac{50}{2P/QN - 1} \begin{cases} P = 1, 2, 3 \ldots \\ v_{ref} \neq 50/(2P + 1) \end{cases} \tag{6}$$

Then the 50 periodic noise will give no contribution to the output signal.

C. The design of the SBPR filter.

The general function of an SBPR filter is theoretically explained in the article by Komachi and Tanaka in J.Sci.Instr. 8 (1975) 967, hereby included by reference, although their embodiment does not work according to their theory.

The signal to be detected is integrated over time intervals typically much shorter than the period of the signal as illustrated in FIG. 1H. The time increment is one N:th part of the period of the reference frequency. The output at a given time is the difference between two sums of such integrals; for example, in FIG. 1H the difference between the sum of the three integrals marked 1 and the sum of the three integrals marked 5. In the filter described by Komachi and Tanaka each such sum has contributions from an unlimited number of integrals which are damped by a complicated weight function giving the largest weight to the latest completed integral. In the SBPR filter of the present invention, on the other hand, equal weight is given to a predetermined number (P) of the latest completed integrals and zero weight to the older integrals.

The described operation can be performed by an apparatus consisting of N·P integrators. The number of integrators used may be much smaller if so-called sample-hold circuits known in the art are used as storing units.

The embodiment of the SBPR filter we have built is very similar to the embodiment of the SLP filter previously described, and corresponds to the case N=6 and P=1. Each of the six integrators is provided with two switches in parallel on the outputs $c_+$ and $c_-$. These two switches are connected to the two inputs of the differential amplifier constituting the analog calculating means.

The integrators have five different states of operation. With the switches $c_+$ and $c_-$ being connected to the two inputs of the differential amplifier, the setting of the switches is given in Table III.

TABLE III

| State of integrator | | Setting of switches | | | |
|---|---|---|---|---|---|
| | | a | b | $c_+$ | $c_-$ |
| $U^+$: | Input on ground Output to positive side of diff. amp. | 0 | 0 | 1 | 0 |
| $U^-$: | Input on ground Output to negative side of diff. amp. | 0 | 0 | 0 | 1 |
| R: | Reset, input on ground Capacitor shorted | 0 | 1 | 0 | 0 |
| S: | Integrating signal Output open | 1 | 0 | 0 | 0 |
| T: | Idle | 0 | 0 | 0 | 0 |

We have chosen to let the latest charged integrator be connected to the positive side of the differential amplifier, while the negative side is connected to the integrator charged q time increments earlier. (q can be chosen as 2 or 3 in the constructed embodiment.) The integrator being in turn to integrate is reset.

For q=2, the switch control means is arranged to operate the integrators according to Table IV.

TABLE IV

| Integrator | Time increment | | | | | |
|---|---|---|---|---|---|---|
| | 1 | 2 | 3 | 4 | 5 | 6 |
| I1 | S | $U^+$ | T | $U^-$ | T | R |
| I2 | R | S | $U^+$ | T | $U^-$ | T |
| I3 | T | R | S | $U^+$ | T | $U^-$ |
| I4 | $U^-$ | T | R | S | $U^+$ | T |
| I5 | T | $U^-$ | T | R | S | $U^+$ |
| I6 | $U^+$ | T | $U^-$ | T | R | S |

D. Theory of the SBPR filter.

Let a signal of frequency $v_o$ and amplitude A $$U_{in}(t) = A e^{j2\pi v_o t} \tag{7}$$

be connected to the input of the filter. The output of the filter will have the form of a step function $$U_{out}(r) = \tag{8}$$
$$-\frac{8iA}{\pi R C v_o} \frac{\sin(\pi P \frac{v_o}{v_{ref}})}{\sin(\pi \frac{v_o}{v_{ref}})} \cdot \sin(\pi \frac{v_o}{v_{ref}} \frac{q}{N}) \sin(\pi \frac{v_o}{N v_{ref}}) \cdot$$
$$\cdot e^{i\pi \frac{v_o}{v_{ref}} (P - 1 - \frac{3+q}{N})} \cdot e^{i 2\pi \frac{v_o}{v_{ref}} \frac{r}{N}}$$

One cycle of the reference frequency $v_{ref}$ is divided into N equal time intervals, constituting the time increment. P is the number of integrals summed to each input of the differential amplifier, and r is the integral part of $(Nv_{ref}t+1)$.

With P much larger than one, the filter will have narrow band-pass characteristics.

In general, the SBPR filter is not sensitive to the phase relation between the detected signal and the reference signal. However, with certain values for N and q, the SBPR filter will exhibit the same phase-sensitivity as the SLP filter for some values of $v_o/v_{ref}$.

Setting N=6, P=1 in eq (6) we get the output of the constructed embodiment of the SBPR filter when an AC signal of frequency $v_o$ is applied to its input.

Figure 5:
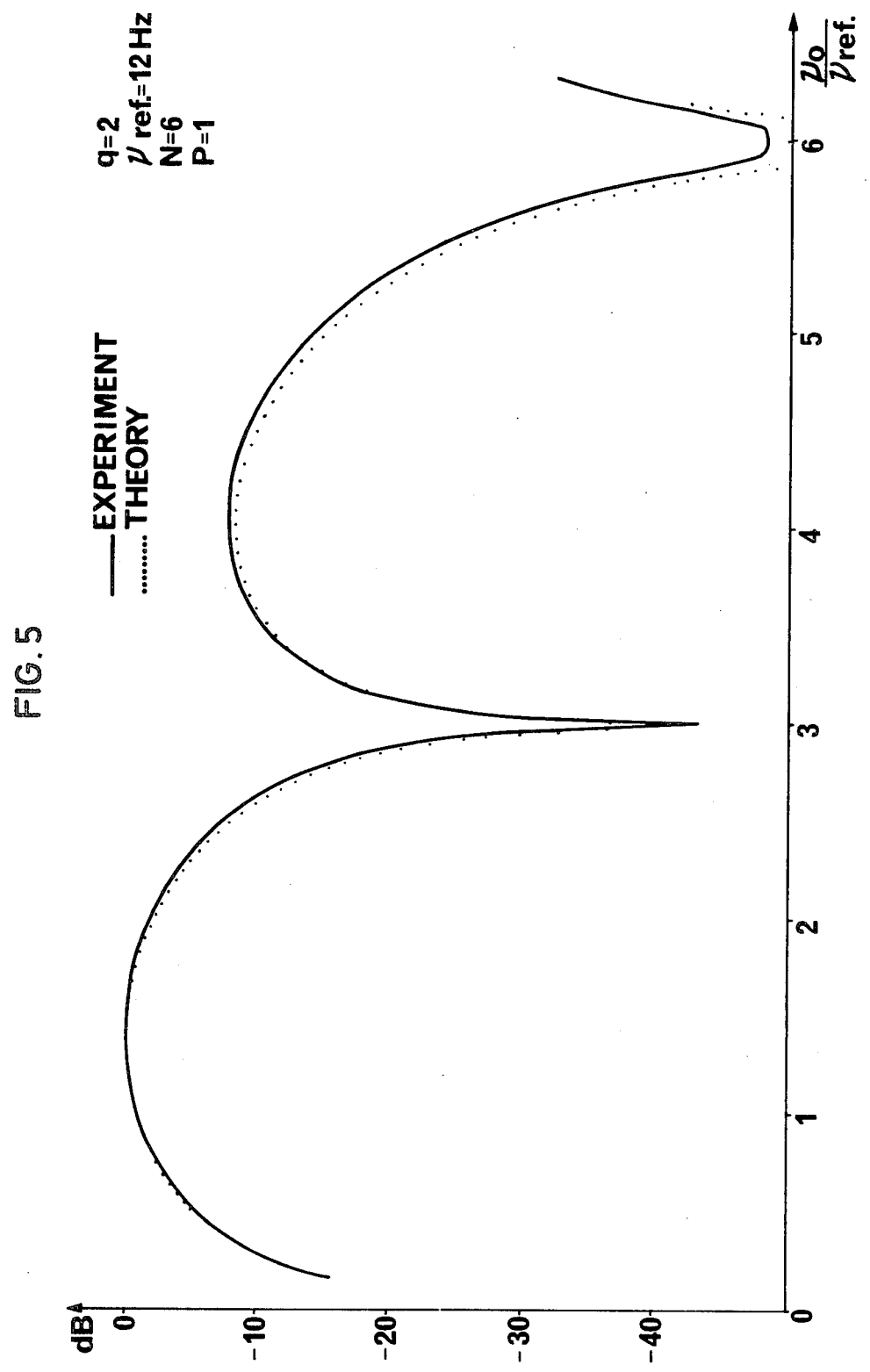
FIG. 5 shows response curves according to the invention in the SBPR application and comparison with theory.

The RMS of this equation is plotted in FIG. 5 for q=2 together with the response of the SBPR embodiment. From eq (9) we see that the filter should have zero response for the third harmonic ($v_o=3v_{ref}$) of the reference frequency.

PERFORMANCE OF THE EMBODIMENTS DESCRIBED

FIG. 4A shows the frequency response for a prior art lock-in amplifier (PAR HR8) with a conventional low-pass filter. FIG. 4B shows the frequency response of the same lock-in amplifier in which the low-pass filter has been substituted by the filter of the present invention. (The oscillating nature of the curves is, of course, due to the phase sensitivity of the lock-in amplifier.) It should be noted that, in both cases, the frequency response is modified by the narrow band-pass amplifier included in the HR8 prior to the mixer. The center frequency (lock-in frequency) was in both cases 32 Hz, the RC time constant 1 sec. In the filter according to the invention the mean value was taken at each time over 64 periods or 2 sec. This may be considered as roughly corresponding to an equivalent time constant of 0.8 sec. It is clear from FIG. 4B that the SLP filter exhibits effective band reject properties. At frequencies as close as ±3% from the central peak, the response is close to zero.

FIGS. 4C and 4D were recorded with the same equipments as FIGS. 4A and 4B respectively. The band-pass amplifier prior to the mixer was set at 32 Hz, whereas the mixer frequency was 16 Hz. We see that there is considerable improvement of the rejection at twice the mixer frequency. The RC time constant was 300 msec., and the mean according to the invention was taken over 16 periods.

Figure 4E:
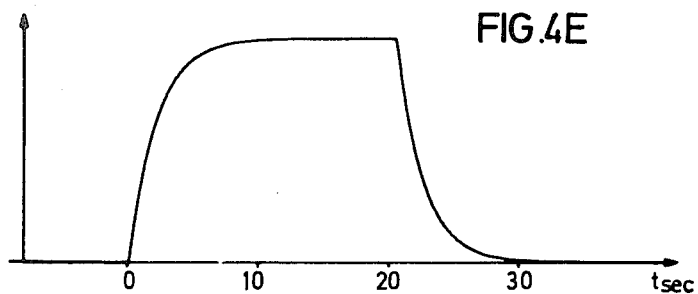
Figure 4F:
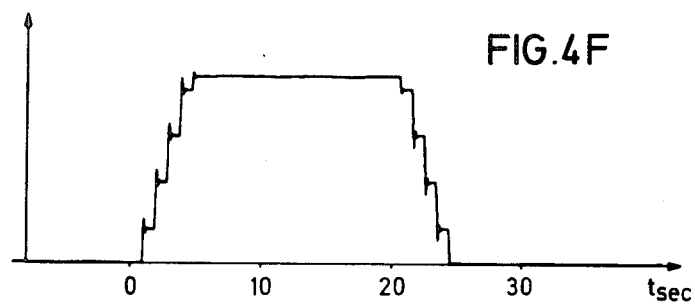

FIGS. 4E and 4F show the response to a square pulse for the two cases. The lock-in frequency was 32 Hz and the Q-value of the band-pass amplifier was set to 5.

Figure 4G:
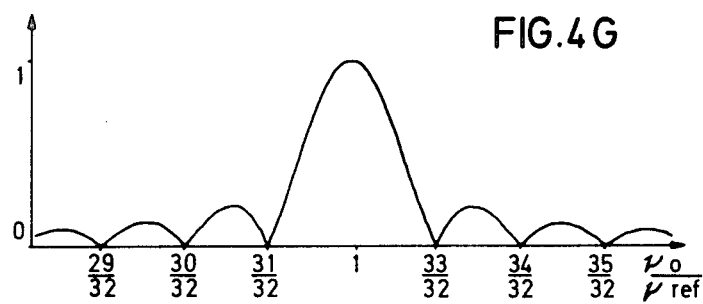
Figure 4H:
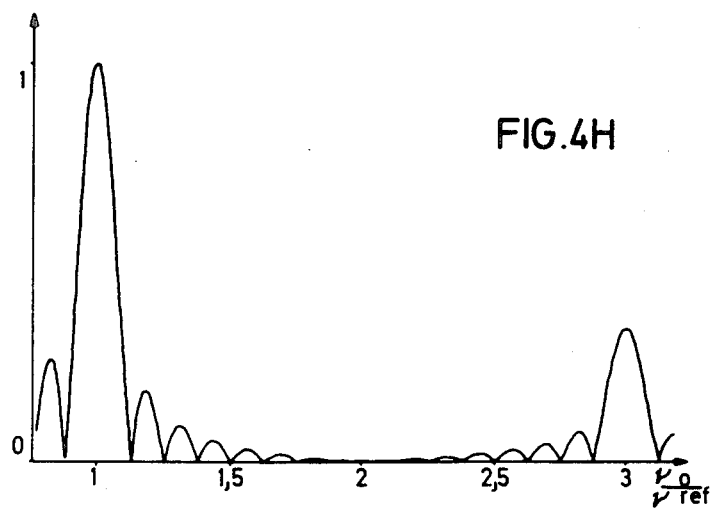

FIGS. 4G and 4H show the theoretical behaviour of the SLP embodiment. This was obtained from eq (3). We can see that the experimental results (FIGS. 4B and 4D) are in good agreement with the theory.

The SBPR embodiment was tested by applying a sinusoidal AC signal to the input and measuring the response with an RMS detector with logarithmic response. A typical curve is shown in FIG. 5 together with the theoretical curve obtained from eq 7. As can be seen in the figure, the agreement is very good.

SUGGESTED APPLICATIONS

It is rather common that the information to be extracted appears as a modulation of a given frequency on a carrier wave. The modulation frequency causes side bands. With the synchronous filters of the invention, it is possible to effectively separate out these side bands from the carrier by letting the carrier frequency coincide with a zero of the response functions of the filters while the filters have large response for one (or several) of the side bands.

It is possible to take advantage of the synchronous filters when transmitting information, e.g. digital data. If it is wanted to transmit data on several closely spaced $$U_{out}(r) = -\frac{8iA}{\pi R C v_o} \sin(\pi \frac{v_o}{v_{ref}} \frac{q}{6}) \sin(\frac{\pi}{6} \frac{v_o}{v_{ref}}) e^{-i\frac{\pi}{6} \frac{v_o}{v_{ref}}(3+q)} e^{i\frac{\pi}{3} \frac{v_o}{v_{ref}} r} \tag{9}$$

carrier frequencies, the synchronous filter of one of the detectors should have zero response for all carrier frequencies but one.

It may be observed that an SBPR filter can be used prior to the mixer in a lock-in amplifier having an SLP filter at the output. With this configuration it is possible to eliminate the response to e.g. the third harmonic of the reference frequency.

The use of synchronous filters may be advantageous when the final output is registered by a digital voltmeter. The sampling time of the voltmeter should be shorter than the length of the steps of the step function at the output of the filter, so that the digital voltmeter has constant input voltage during the whole sampling time.

It is intended that all such embodiments, which suggest themselves to the man of the art when reading our disclosure, shall be comprised in the appended claims.

We claim:

1. A filter circuit for analog signals comprising
a plurality of integrating circuits, each provided with a separate signal input, a separate signal output and a separate resetting input,
clock pulse means for generating a series of clock pulses,
a filter input for receiving an analog signal to be filtered,
analog output means responsive to said signal outputs of said integrating circuits, and
switching means operable by said clock pulses for sequentially and cyclically switching said filter input to said signal input of each of said integrating circuits,
said switching means being adapted to reset said resetting input of at least one other sequentially selected integrating circuit and to sequentially switch the outputs of at least two of said integrating circuits not being switched to said filter input nor being reset to said analog output means.

2. A filter circuit of claim 1, wherein said signal outputs of a predetermined number of said integrating circuits being switched to said filter input and being reset, respectively, are switched to said analog output means which operates as a summing network.

3. A filter circuit of claim 1, wherein said analog output means comprises calculating means having two inputs which are sequentially switched to an output of each of two of said integrating circuits for calculating the difference between the signals applied to said inputs.

4. A filter circuit of claim 1, wherein said switching means comprises sequencing means including a shift register operable by said clock pulses from said clock means for sequentially activating said integrating circuits.

5. A filter circuit for analog signals comprising
a plurality of integrating circuits, each integrating circuit having a signal input, a signal output and a resetting input,
clock pulse means for generating a series of clock pulses,
a filter input for receiving an analog signal to be filtered,
output means responsive to said signal outputs of said integrating circuits,
summing means coupled to said output means of the filter circuit,
switching means operable by said clock pulses for sequentially and cyclically switching said filter input to said signal input of each one of said integrating circuits, said switching means being adapted to reset said resetting input of another sequentially selected integrating circuit, said signal outputs of said integrating circuits except said last-mentioned two integrating circuits being switched to said summing means.

6. A filter circuit of claim 5, wherein said switching means comprises sequencing means including a shift register operable by said clock pulses from said clock means for sequentially activating said integrating circuits.

7. A filter circuit for analog signals from a phase sensitive detector having a reference frequency $v_{ref}$, said circuit comprising
a plurality of integrating circuits, each integrating circuit having a signal input, a signal output and a resetting input,
clock pulse means for generating a series of clock pulses,
a main filter input for receiving an analog signal to be filtered,
output means responsive to said signal outputs of said integrating circuits,
summing means coupled to said output means of the filter circuit, and
switching means operable by said clock pulses for sequentially and cyclically switching said main filter input to said signal input of each of said integrating circuits one at a time,
said switching means being adapted to reset said resetting input of another sequentially selected integrating circuit, said signal outputs of said integrating circuits except said last-mentioned two integrating circuits being switched to said summing means, said clock pulse means having a clock pulse frequency determined by the expression $2\ v_{ref}/Q$, where Q is an integer.

* * * * *